(12) United States Patent
Kim et al.

(10) Patent No.: US 7,453,716 B2
(45) Date of Patent: Nov. 18, 2008

(54) SEMICONDUCTOR MEMORY DEVICE WITH STACKED CONTROL TRANSISTORS

(75) Inventors: Sung-min Kim, Incheon Metropolitan (KR); Eun-jung Yun, Seoul (KR); Jong-soo Seo, Hwaseong-si (KR); Du-eung Kim, Yongin-si (KR); Beak-hyung Cho, Hwaseong-si (KR); Byung-seo Kim, Suwon-si (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 11/238,381

(22) Filed: Sep. 29, 2005

(65) Prior Publication Data
US 2006/0120148 A1 Jun. 8, 2006

(30) Foreign Application Priority Data
Oct. 26, 2004 (KR) ............ 10-2004-0085804
Apr. 26, 2005 (KR) ............ 10-2005-0034552

(51) Int. Cl.
*G11C 11/00* (2006.01)

(52) U.S. Cl. ............ 365/148; 365/63; 365/163; 365/242; 438/95

(58) Field of Classification Search ............ 257/1, 257/2, 3, 4, 5, 74; 365/148, 161, 163, 242, 365/243, 63; 438/95, 96
See application file for complete search history.

(56) References Cited

U.S. PATENT DOCUMENTS

| | | | | |
|---|---|---|---|---|
| 4,119,924 A * | 10/1978 | Ahmed | ............ | 330/288 |
| 5,010,520 A | 4/1991 | Minagawa et al. | ............ | 365/174 |
| 5,686,335 A * | 11/1997 | Wuu et al. | ............ | 438/154 |
| 5,883,827 A | 3/1999 | Morgan | ............ | 365/100 |
| 6,034,882 A * | 3/2000 | Johnson et al. | ............ | 365/103 |
| 6,480,438 B1 | 11/2002 | Park | ............ | 365/230.06 |
| 6,487,113 B1 | 11/2002 | Park et al. | ............ | 365/163 |
| 6,775,176 B2 * | 8/2004 | Kihara | ............ | 365/149 |
| 6,862,214 B2 * | 3/2005 | Lee et al. | ............ | 365/163 |
| 6,937,505 B2 * | 8/2005 | Morikawa | ............ | 365/158 |
| 7,002,837 B2 * | 2/2006 | Morimoto | ............ | 365/148 |

(Continued)

*Primary Examiner*—VanThu Nguyen
*Assistant Examiner*—Alexander Sofocleous
(74) *Attorney, Agent, or Firm*—Mills & Onello LLP

(57) ABSTRACT

In a semiconductor memory device and method, phase-change memory cells are provided, each including a plurality of control transistors formed on different layers and variable resistance devices formed of a phase-change material. Each phase-change memory cell includes a plurality of control transistors formed on different layers, and a variable resistance device formed of a phase-change material. In one example, the number of the control transistors is two. The semiconductor memory device includes a global bit line; a plurality of local bit lines connected to or disconnected from the global bit line via local bit line selection circuits which correspond to the local bit lines, respectively; and a plurality of phase-change memory cell groups storing data while being connected to the local bit lines, respectively. Each of the phase-change memory cells of each of the phase-change memory cell groups comprises a plurality of control transistors formed on different layers, and a variable resistance device formed of a phase-change material. In addition, the semiconductor memory device has a hierarchical bit line structure that uses a global bit line and local bit lines. Accordingly, it is possible to increase both the integration density of the semiconductor memory device and the amount of current flowing through each of the phase-change memory cells.

41 Claims, 12 Drawing Sheets

U.S. PATENT DOCUMENTS

| | | | |
|---|---|---|---|
| 7,061,790 B2 * | 6/2006 | Morimoto et al. | 365/148 |
| 7,286,394 B2 * | 10/2007 | Ooishi | 365/158 |
| 7,309,885 B2 * | 12/2007 | Park et al. | 257/211 |
| 7,345,899 B2 * | 3/2008 | Nirschl et al. | 365/63 |
| 2004/0029310 A1 * | 2/2004 | Bernds et al. | 438/99 |
| 2005/0030787 A1 * | 2/2005 | Lowrey et al. | 365/163 |
| 2005/0030800 A1 * | 2/2005 | Johnson et al. | 365/200 |
| 2006/0077737 A1 * | 4/2006 | Ooishi | 365/203 |
| 2007/0034908 A1 * | 2/2007 | Cho et al. | 257/260 |
| 2007/0268742 A1 * | 11/2007 | Liu | 365/163 |

* cited by examiner

SEMICONDUCTOR MEMORY DEVICE WITH STACKED CONTROL TRANSISTORS

CROSS-REFERENCE TO RELATED PATENT APPLICATIONS

This application claims the priority of Korean Patent Application Nos. 10-2004-0085804, filed on Oct. 26, 2004 and 10-2005-0034552, filed on Apr. 26, 2005 in the Korean Intellectual Property Office, the disclosures of which are incorporated herein in their entirety by reference.

BACKGROUND OF THE INVENTION

1. Field of the Invention

The present invention relates to a semiconductor memory device, and more particularly, to a semiconductor memory device with a stacked memory cell.

2. Description of the Related Art

A Phase-change random Access Memory (PRAM) is formed of a phase-change material such as a chalcogenide alloy that changes into a first of two phases when it is heated and cooled, and changes into a second phase when it is heated and cooled again. Here, the two phases are crystalline and amorphous phases. The PRAM is disclosed in U.S. Pat. Nos. 6,487,113 and 6,480,438. The PRAM has a low resistance value when it becomes crystalline, and a high resistance value when it is amorphous. A logic value can be determined as 0 or 1 according to the resistance value of the PRAM. The crystalline-phase of the PRAM corresponds to a set state or has a logic value of 0, and the amorphous phase thereof corresponds to a reset state or has a logic value of 1.

To change the phase of the PRAM into the amorphous phase, the PRAM is heated to a temperature greater than a melting temperature of the PRAM and rapidly cooled down. To change the phase of the PRAM into the crystalline phase, the PRAM is heated to a temperature lower than the melting temperature for a predetermined time.

A key point to the PRAM is that it is formed of a phase-change material such as chalcogenide. In general, the phase-change material is a GST alloy composed of germanium (Ge), antimony (Sb), and tellurium (Te). When the GST alloy is heated or cooled, its state rapidly changes between the amorphous state (reset state) and the crystalline state (set state), that is, its logic value is switched between 1 and 0. Therefore, the GST alloy is useful as a material for a PRAM memory device.

To write data to a memory cell of the PRAM, the chalcogenide is heated to a temperature equal to or greater than its melting temperature and rapidly cooled down to place the chalcogenide in an amorphous state. Otherwise, chalcogenide is heated at a temperature less than the melting temperature, maintained at the temperature, and cooled to change the chalcogenide into a crystalline state.

FIG. 1 is a circuit diagram of a conventional phase-change memory cell 10 disclosed in U.S. Pat. No. 5,883,827. The memory cell 10 includes a phase-change variable resistance device R1, a first terminal of which is connected to a bit line BL and a second terminal of which is connected to a drain of a selection transistor N1, and the selection transistor N1 whose gate is connected to a word line WL and whose source is connected to a reference voltage VSS.

FIG. 2 is a circuit diagram of a phase-change memory array 100 comprising a plurality of phase-change memory cells 10 equivalent to the phase-change memory 10 of FIG. 1. The plurality of phase-change memory cells 10 are connected to a bit line BL which is connected to a sense amplifier (not shown).

The PRAM has lately attracted considerable attention as a next-generation memory. However, integrity of the PRAM needs to be improved in order for the PRAM to be competitive with other types of memory, such as Dynamic Random Access Memory (DRAM), Static Random Access Memory (SRAM), and flash memory.

As described above, data is written to the PRAM by heating the PRAM using Joule heat. However, there is a restriction to reducing a size of a control transistor of a conventional memory cell, which supplies current required to generate the Joule heat, thereby preventing an increase in the integration density of the PRAM.

Accordingly, there is a growing requirement for a cell structure that can increase the integration density of the PRAM and an improvement of the configuration of a semiconductor memory device using the improved cell structure.

SUMMARY OF THE INVENTION

The present invention provides a phase-change memory cell with improved integration density.

The present invention also provides a semiconductor memory device with such a random change access memory (PRAM) cell.

According to an aspect of the present invention, there is provided a phase-change memory cell comprising a plurality of control transistors formed on different layers, and a variable resistance device formed of a phase-change material.

In one embodiment, the number of control transistors is two.

In another embodiment, the control transistors include a first control transistor which is a bulk transistor, and a second control transistor which is formed on the first control transistor and is a thin layer transistor.

In another embodiment, the control transistors further include a third control transistor formed on the second control transistor. The control transistors may be MOS transistors, and form a diode. The control transistors may optionally comprise bipolar transistors. The second control transistor may be formed on the first control transistor. The variable resistance device may comprise germanium (Ge), antimony (Sb), and tellurium (Te).

According to another aspect of the present invention, there is provided a semiconductor memory device comprising a global bit line; a plurality of local bit lines connected to or disconnected from the global bit line through local bit line selection circuits which correspond to the local bit lines, respectively; and a plurality of phase-change memory cell groups storing data when connected to the local bit lines, respectively. Each of the phase-change memory cells of each of the phase-change memory cell groups comprises a plurality of control transistors formed on different layers, and a variable resistance device formed of a phase-change material.

In one embodiment, the local bit line selection circuits are transistors which connect the local bit lines to the global bit line or disconnect the local bit lines from the global bit line, in response to a local bit line selection signal. Gates of all the control transistors are connected to a corresponding word line.

In another embodiment, the semiconductor memory device optionally further includes a peripheral circuit. The peripheral circuit may comprise an inverter circuit which includes a bulk transistor formed on a first layer and a thin layer transistor formed on a second layer. The bulk transistor may comprise an NMOS transistor and the thin layer transistor may comprise a PMOS transistor.

In another embodiment, the semiconductor memory device further includes a sense amplifier connected to the global bit line.

According to yet another aspect of the present invention, there is provided a phase-change memory cell including a plurality of control transistors gates of which are connected to a word line and which are formed on different layers, and a variable resistance device. One of a first terminal and a second terminal of each control transistor is connected to the variable resistance device and the other is connected to a ground voltage source.

According to still another aspect of the present invention, there is provided a phase-change memory cell including a first control transistor formed on a first substrate and having a source, gate, and drain, a second substrate formed on the first control transistor; a second control transistor formed on the second substrate and having a source, gate, and drain; and a variable resistance device connected to one of the source and the drain of the second control transistor and formed of a phase-change material.

In one embodiment, the source of the first control transistor is electrically connected to the source of the second control transistor, the drain of the first control transistor is electrically connected to the drain of the second control transistor, and the gate of the first control transistor is electrically connected to the gate of the second control transistor.

In another embodiment, the first and second control transistors have a planar transistor structure, a fin field effect transistor structure, or a multi-channel field effect transistor structure.

In another embodiment, the second substrate is formed to be parallel with the first substrate and partially overlap the first substrate. A first contact plug which connects the variable resistance device to one of the source and the drain of the first control transistor, and a second contact plug which connects an external power source to one of the source and the drain of the first control transistor are formed of a conductive layer.

In another embodiment, the contact plugs are connected to the source and drain of the second control transistor.

According to still another aspect of the present invention, there is provided a method of fabricating a phase-change memory cell, the method including forming a first control transistor having a source, gate, and drain on a first substrate; forming a second substrate on the first control transistor; forming a second control transistor having a source, gate, and drain on the second substrate; and connecting a variable resistance device to one of the source and the drain of the second control transistor, the variable resistance device formed of a phase-change material.

In one embodiment, the method further includes forming a first contact plug which connects the variable resistance device to one of the source and the drain of the first control transistor, and a second contact plug which connects an external power source to one of the source and the drain of the first control transistor.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
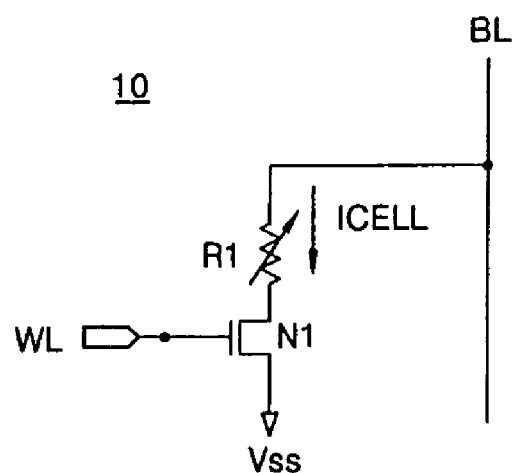
FIG. 1 is a circuit diagram of a conventional phase-change memory cell.
Figure 2:
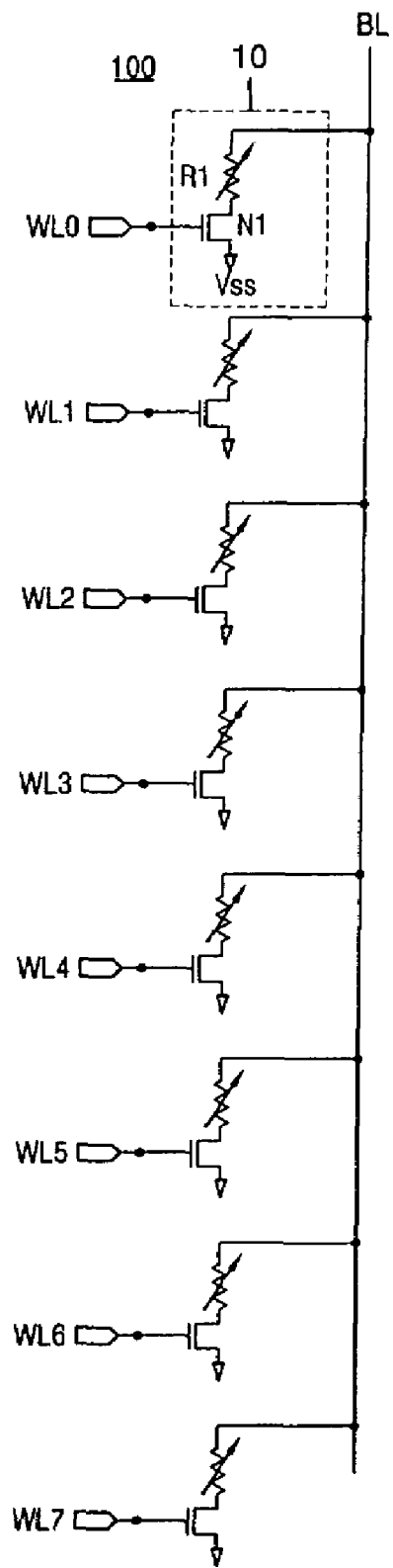
FIG. 2 is a circuit diagram of a phase-change memory array with a plurality of phase-change memory cells equivalent to the phase-change memory cell of FIG. 1.

Hereinafter, exemplary embodiments of the present invention will be described in detail with reference to the accompanying drawings. Like reference numerals are used to designate like or equivalent elements throughout this disclosure.

A cell structure of a semiconductor memory device according to an embodiment of the present invention will now be described with reference to FIGS. 3 and 4. In this embodiment, the semiconductor memory device indicates a phase-change random access memory (PRAM) formed of a phase-change material.

Figure 3A:
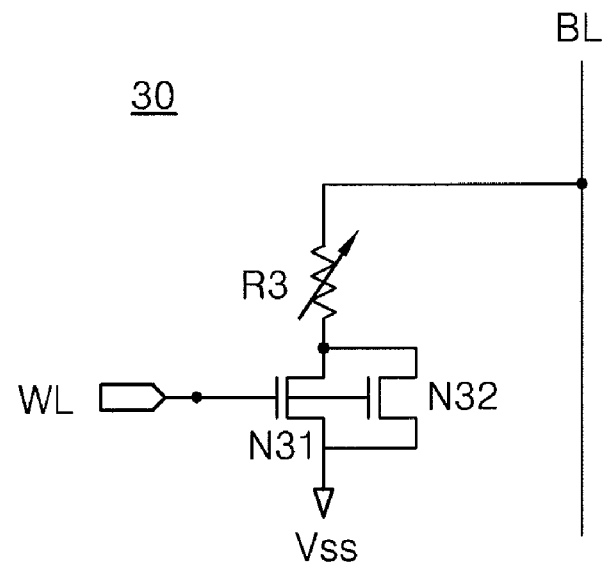
FIG. 3A is a circuit diagram of a phase-change memory cell according to an embodiment of the present invention.

Referring to FIG. 3A, a phase-change memory cell 30 includes first and second control transistors N31 and N32 on different layers, and a variable resistance device R3 formed of a phase-change material.

Gates of the first and second control transistors N31 and N32 are connected to a word line WL. A first terminal of each of the first and second control transistors N31 and N32 is connected to a reference voltage, e.g., a ground voltage Vss.

A second terminal of each of the respective first and second control transistors N31 and N32 is connected to a first terminal of the variable resistance device R3. A second terminal of the variable resistance device R3 is connected to a bit line BL.

Figure 4A:
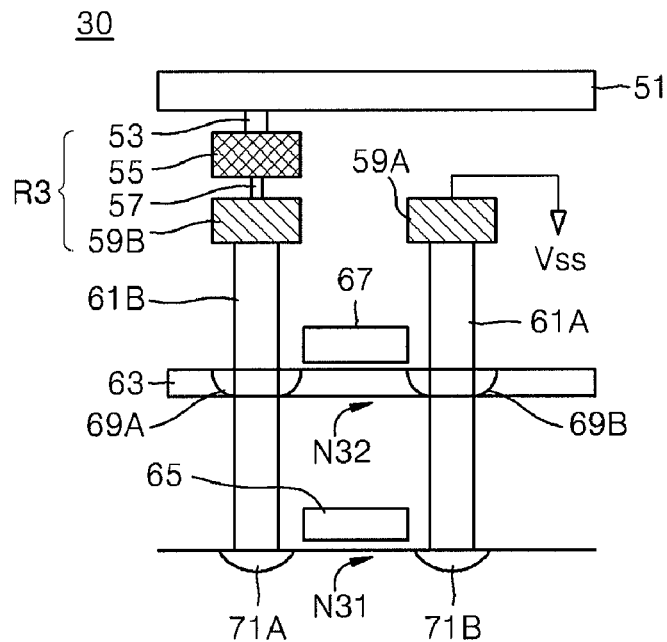
FIG. 4A is a diagram illustrating the vertical structure of the phase-change memory cell of FIG. 3A.

Referring to FIG. 4A, the first and second control transistors N31 and N32 are formed on different layers. In one embodiment, the first control transistor N31 is a bulk transistor and the second control transistor N32 is a thin layer transistor formed in layer 63. Both a gate electrode 65 of the first control transistor N31 and a gate electrode 67 of the second control transistor N32 are connected to a word line (not shown).

Both a source electrode 71B of the first control transistor N31 and a source electrode 69B of the second control transistor N32 are connected to the ground voltage Vss and a first landing pad 59A via a first contact plug 61A. Both a drain electrode 71A of the first control transistor N31 and a drain electrode 69A of the second control transistor N32 are connected to a second landing pad 59B via a second contact plug 61B.

The landing pad 59B is connected to a phase change layer 55 via a lower electrode 57. The phase change layer 55 is connected to a local bit line 51 via an electrode 53. The second control transistor N32 is a thin layer transistor formed on a silicon epitaxial layer (not shown).

In different embodiments for different applications, the first and second control transistors N31 and N32 may be MOS transistors or bipolar transistors, and may form a diode.

According to this embodiment, the control transistors N31 and N32 are formed on different layers to increase the integration density of the semiconductor memory 30 device. The phase-change memory cell 30 includes the control transistors N31 and N32 to increase the amount of current flowing through the variable resistance device R3, which in turn provides the necessary heat for rapidly changing the phase of the device. However, the inclusion of multiple control transistors N31 and N32 would increase the size of the phase-change memory cell 30. To solve this problem, the multiple control transistors N31 and N32 are formed on different layers of the device.

Figure 3B:
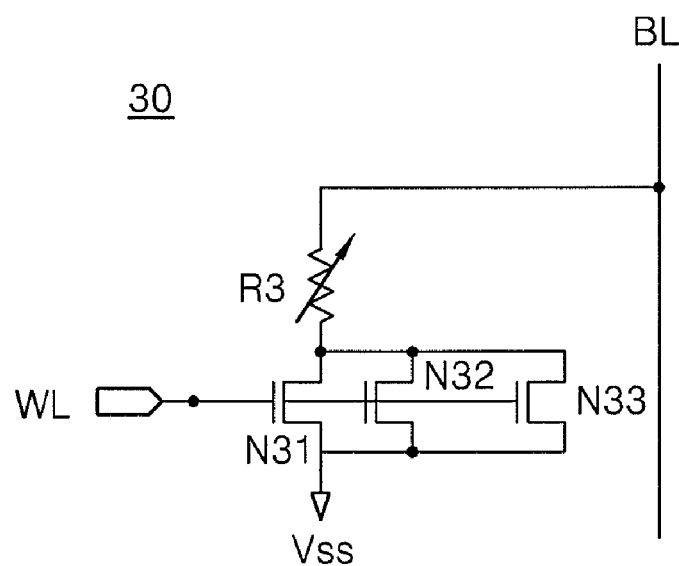
FIG. 3B is a circuit diagram of a phase-change memory cell comprising a third control transistor according to an embodiment of the present invention.
Figure 4B:
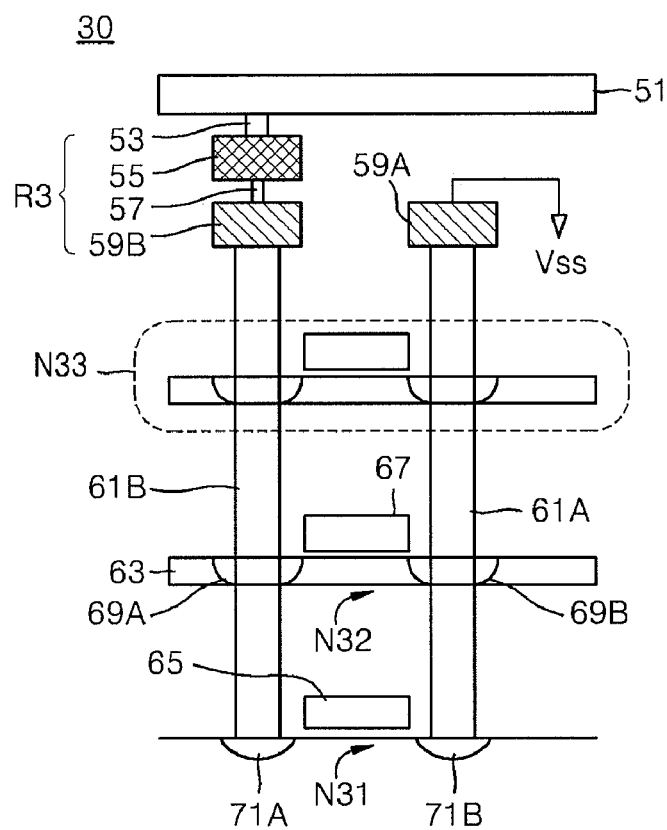
FIG. 4B is a diagram illustrating the vertical structure of the phase-change memory cell of FIG. 3B.

As shown in FIGS. 3B and 4B, a third control transistor N33 that is a thin layer transistor may be added to the phase-change memory cell 30 to further increase the integration of the phase-change memory cell 30.

Figure 5:
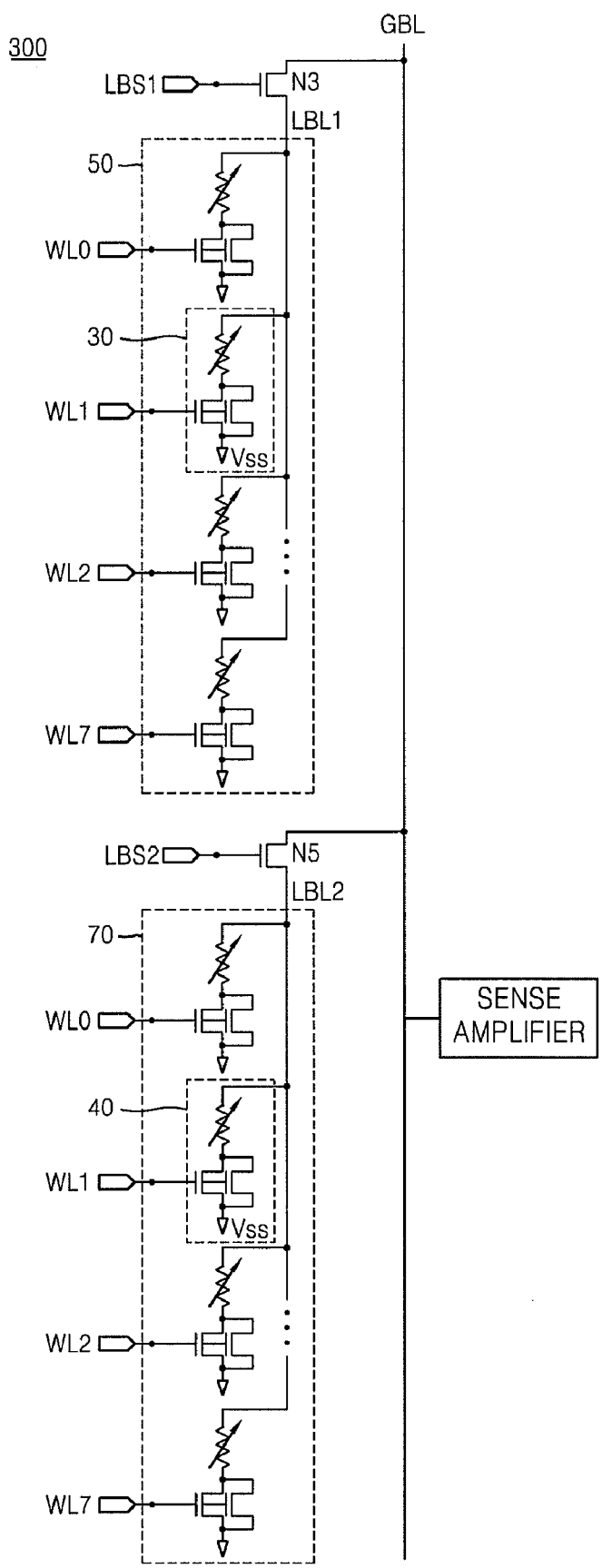
FIG. 5 is a circuit diagram of a phase-change memory array of a semiconductor memory device according to an embodiment of the present invention, the phase-change memory array including a plurality of phase-change memory cells equivalent to the phase-change memory cell of FIG. 3.

FIG. 5 is a circuit diagram of a phase-change memory array 300 of a semiconductor memory device (not shown) according to an embodiment of the present invention. The phase-change memory array 300 includes a global bit line GBL; first and second local bit lines LBL1 and LBL2; and first and second phase-change memory cell groups 50 and 70, such as the phase-change memory cell 30 of FIG. 3, that store data while being connected to the local bit lines LBL1 and LBL2, respectively.

The local bit lines LBL1 and LBL2 are connected to, or disconnected from, the global bit line GBL through first and second local bit line selection circuits N3 and N5, respectively. That is, the local bit line selection circuits N3 and N5 may be transistors that allow the local bit lines LBL1 and LBL2 to be connected to or disconnected from the global bit line GBL in response to local bit line selection signals LBS1 and LBS2. In FIG. 5, only two local bit lines LBL1 and LBL2 are illustrated, but the number of local bit lines is not limited.

Each of a plurality of phase-change memory cells 30 of the first phase-change memory cell group 50, and each of a plurality of phase-change memory cells 40 of the second phase-change memory cell group 70 include a plurality of the control transistors formed on different layers and a variable resistance device formed of a phase-change material. In FIG. 5, the number of phase-change memory cells of each of the phage change memory cell groups 50 and 70 is seven, however, the number of phase-change memory cells is not limited thereto.

Referring to FIG. 5, the phase-change memory cells 30 of the first phase-change memory cell group 50 are connected to the first local bit line LBL1, and the phase-change memory cells 40 of the second phase-change memory cell group 70 are connected to the second local bit line LBL2.

The first local bit line selection circuit N3 connects the first local bit line LBL1 to the global bit line GBL in response to the first local bit line selection signal LBS1. The second local bit line selection circuit N5 connects the second local bit line LBL2 to the global bit line GBL in response to the second local bit line selection signal LBS2.

During a read or write operation, the first and second local bit line selection signals LBS1 and LBS2 allow one of the respective first and second phase-change memory cell groups 50 and 70, for which data is to be read from or written to, to be selected in response to an address signal.

A sense amplifier (not shown) is connected to the global bit line GBL to amplify data read from the selected first or second phase-change memory cell group 50 or 70.

As described above, in a semiconductor memory device according to an embodiment of the present invention, each memory cell is fabricated by forming a plurality of the control transistors on different layers. Accordingly, it is possible to supply a large amount of programming current to a phase-change variable-resistance device while reducing the size of each of the memory cells.

Also, it is possible to realize a hierarchical bit line structure of a phase-change memory cell array of a semiconductor memory device according to the present invention, using a global bit line and local bit lines, thereby enabling manufacture of a compact memory array.

A semiconductor memory device according to the present invention may further include a peripheral circuit (not shown). The peripheral circuit may be an inverter circuit that includes a bulk transistor and a thin layer transistor formed on the bulk transistor. The bulk transistor may be an NMOS transistor and the thin layer transistor may be a PMOS transistor.

When the inverter circuit that includes the NMOS transistor and the PMOS transistor formed on different layers is used as the peripheral circuit, the integration density of the semiconductor memory device is further increased. For instance, it is possible to increase the integration of the semiconductor memory device by adding transistors as peripheral circuits to the structure of the phase-change memory cell 30 of FIGS. 3A and 3B.

According to the present invention, the control transistors constituting a phase-change memory cell are formed on different layers, and the number of the control transistors may be more than one. The control transistor has been described with reference to FIG. 3, and thus, a detailed description will be omitted.

In one application, the semiconductor memory device according to the present invention is installed on a system LS1 logic chip, together with a logic chip.

Figure 6A:
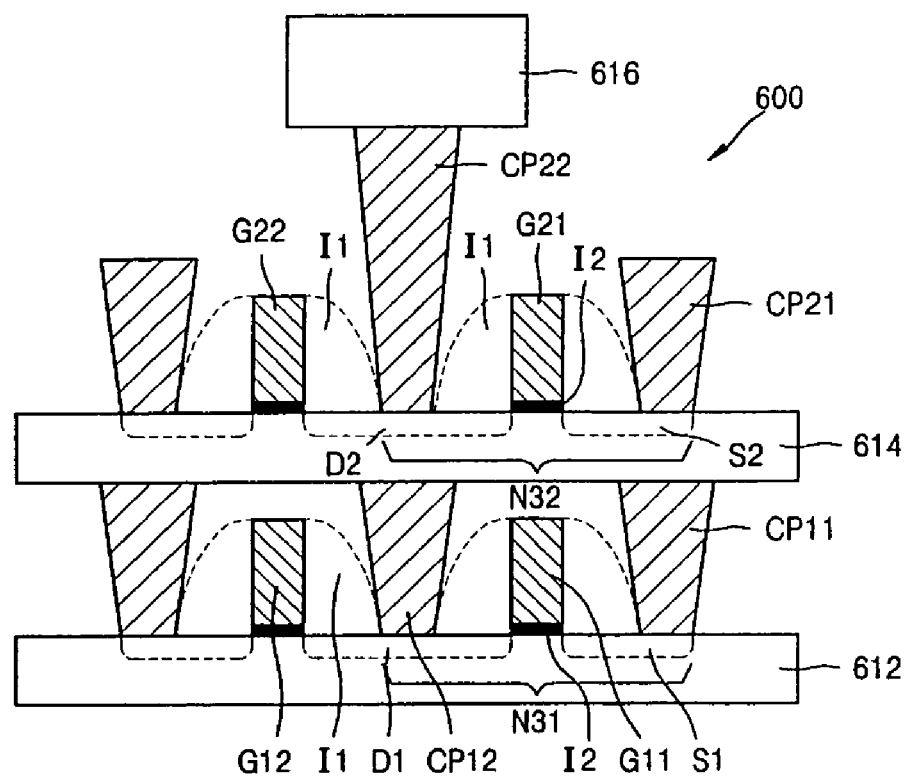
FIG. 6A is a cross-sectional view of a phase-change memory cell according to an embodiment of the present invention.
Figure 6B:
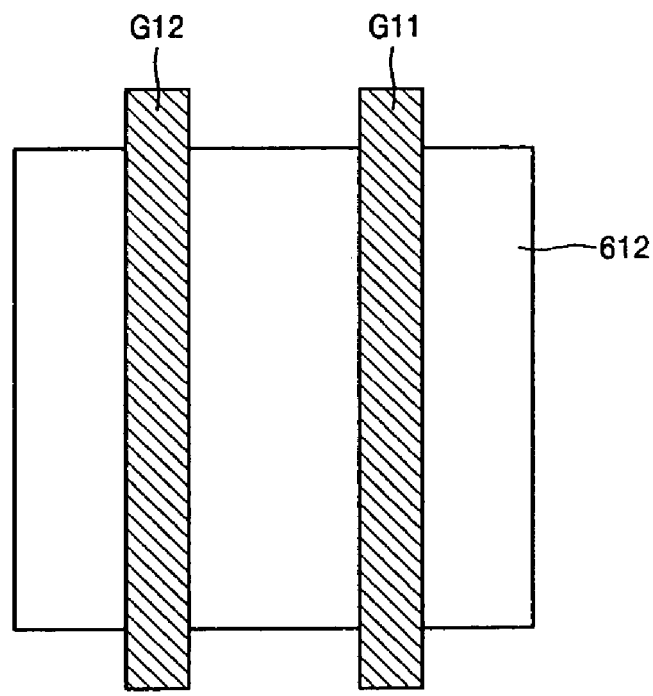
FIG. 6B is a plan view of a first control transistor of the phase-change memory cell of FIG. 6A.
Figure 6C:
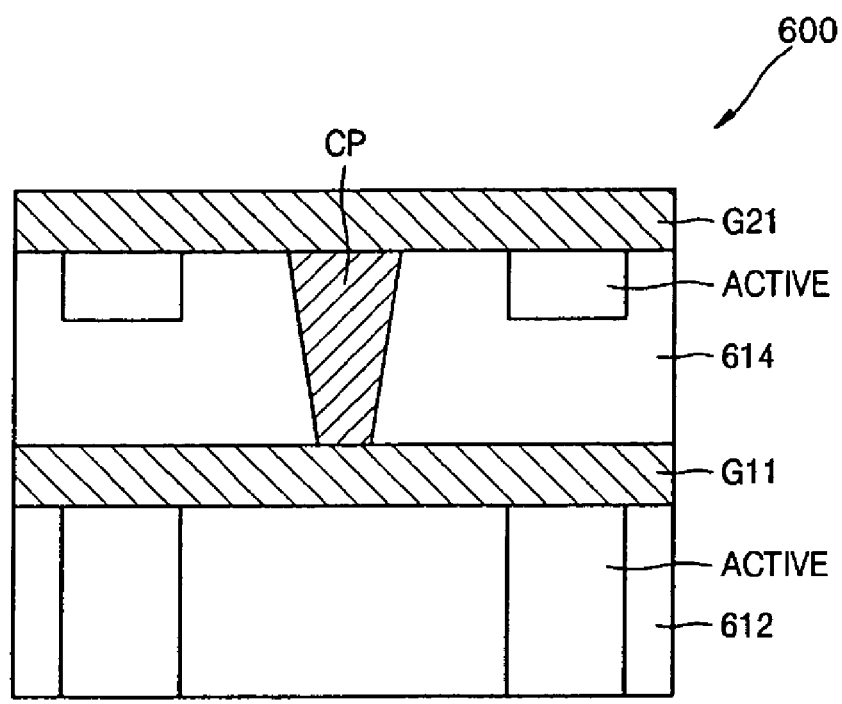
FIG. 6C is a side view of the phase-change memory cell of FIG. 6A.

FIG. 6A is a cross-sectional view of a phase-change memory cell 600 according to an embodiment of the present invention. FIG. 6B is a plan view of a first control transistor N31 of the phase-change memory cell 600 of FIG. 6A. FIG. 6C is a side view of the phase-change memory cell 600 of FIG. 6A.

Referring to FIG. 6A, the phase-change memory cell 600 includes a plurality of the first control transistors N31, each formed on a first substrate 612 and having a source S1, a gate G11, and a drain D1; a second substrate 614 formed on the first control transistors N31; a plurality of second control transistors N32, each formed on the second substrate 614 and having a source S2, a gate G21, and a drain D2; and a variable resistance device 616 connected to one of the source S2, the gate G21, and the drain D2 of one of the second control transistor N32 and formed of a phase-change material.

FIG. 6A illustrates that two of each of the first and second control transistors N31 and N32 are formed on the first and second substrates 612 and 614, respectively, for convenience. However, according to the present invention, there is no limit on both the number of the first control transistors N31 to be formed on the first substrate 612 and the number of the second control transistors N32 to be formed on the second substrate 614.

The phase-change memory cell 600 of FIG. 6A corresponds to a cross-section of the phase-change memory cell 30 illustrated in FIGS. 3 and 4 during manufacture of the phase-change memory cell 30.

The source S1 of the first control transistor N31 is electrically connected to the source S2 of the second control transistor N32, and the drain D1 of the first control transistor N31 is electrically connected to the drain D2 of the second control transistor N32.

These electrical connections are provided via contact plugs CP11 and CP12. Specifically, the source S1 of the first control transistor N31 is connected to the contact plug CP11 which is connected to the second substrate 614. Also, the source S2 of the second control transistor N32 is connected to the contact plug CP21.

Similarly, the drain D1 of the first control transistor N31 is connected to the contact plug CP12 which is connected to the second substrate 614. Also, the drain D2 of the second control transistor N32 is connected to the contact plug CP22.

The contact plugs CP11, CP21, CP12, and CP22 are conductive layers that allow conduction of electricity.

The gate G11 of the first control transistor N31 is electrically connected to the gate G21 of the second control transistor N32. This electric connection is performed via a contact plug CP (not shown in FIG. 6A) of FIG. 6C. In FIG. 6A, I1 denotes an insulating material, and I2 denotes a dielectric layer.

The first and second control transistors N31 and N32 of FIG. 6A have a planar transistor structure. A planar transistor is a transistor whose gate is formed on a substrate. FIG. 6B is a plan view of the first control transistor N31 which is the planar transistor. Referring to FIG. 6B, gates G11 and G12 are formed on the first substrate 612.

FIG. 6C is a side view of the phase-change memory cell 600 of FIG. 6A. Referring to FIG. 6C, the gate G11 of the first control transistor N31 and the gate G21 of the second control transistor N32 are formed horizontally on the first and second substrates 612 and 614, extending the full width at the phase-change memory cell 600. The gates G11 and G21 are electrically connected via the contact plug CP.

In addition, an active region ACTIVE, i.e., a source and drain region, is formed in each of the first and second substrates 612 and 614.

Figure 7A:
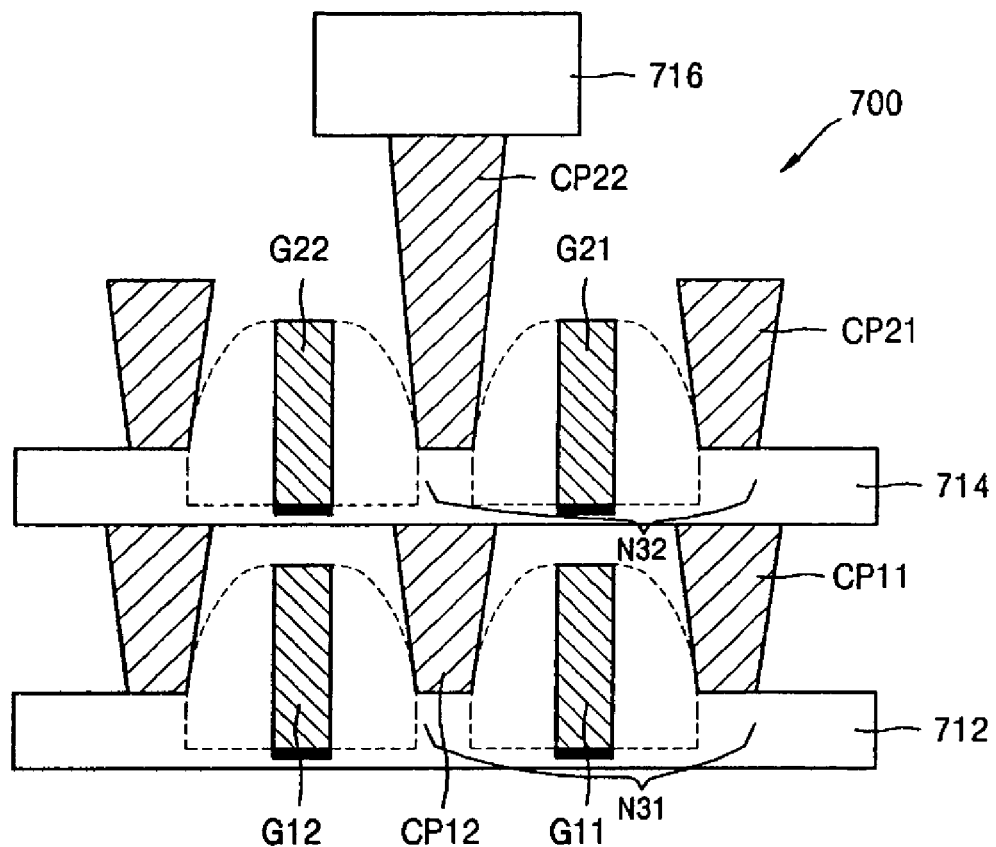
FIG. 7A is a cross-sectional view of a phase-change memory cell according to another embodiment of the present invention.

FIG. 7A is a cross-sectional view of a phase-change memory cell 700 according to another embodiment of the present invention. The construction of the phase-change memory cell 700 is the same as that of the phase-change memory cell 600 of FIG. 6A, except that a plurality of first and second control transistors N31 and N32 have a Fin Field Effect Transistor (FinFET) structure.

That is, the first control transistors N31 are formed on a first substrate 712 and a second substrate 714 is formed on the first control transistors N31. The second control transistors N32 are formed on the second substrate 714.

A variable resistance device 716 is connected to drains of the first and second control transistors N31 and N32 via contact plugs CP12 and CP22, respectively. Also, sources of the first and second control transistors N31 and N32 are electrically connected via contact plugs CP11 and CP21.

The FinFET has a structure in which gate electrodes are formed along both sides of a channel, and, thus the gate electrodes have long channel lengths, thereby suppressing the short-channel effect.

Figure 7B:
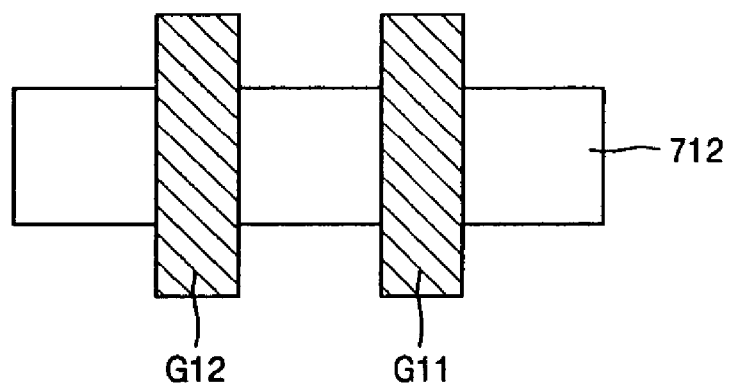
FIG. 7B is a plan view of a first control transistor of the phase-change memory cell of FIG. 7A.

FIG. 7B is a plan view of the first control transistor N31 of the phase-change memory cell 700 of FIG. 7A. FIG. 7B illustrates that the first substrate 712 is smaller in area than the first substrate 612 of FIG. 6B, since the FinFET is used as the first control transistor N31 in the present embodiment.

Figure 7C:
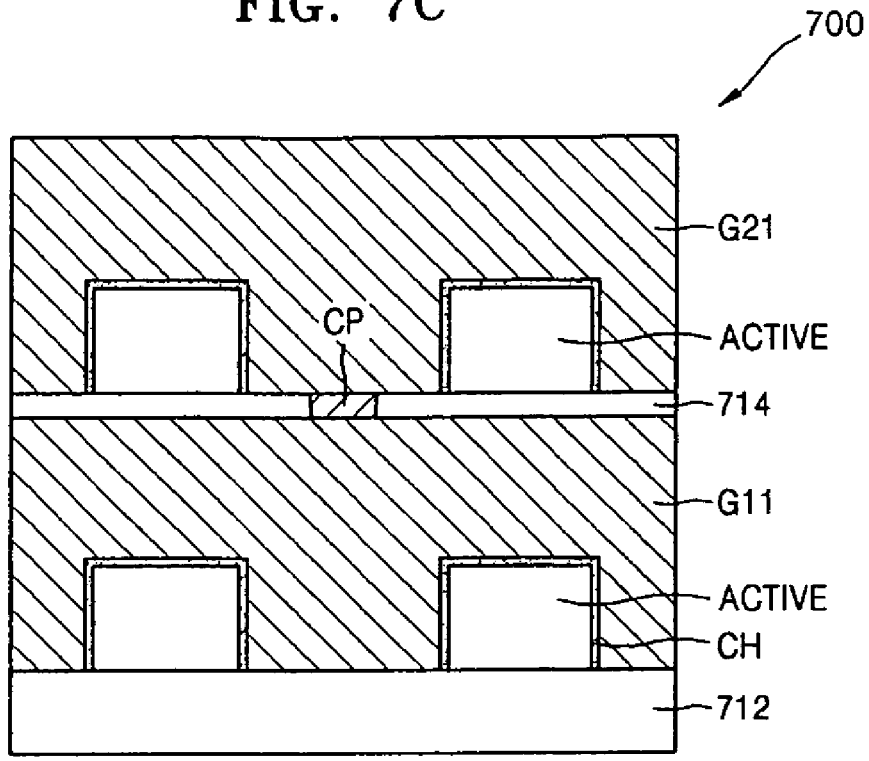
FIG. 7C is a side view of the phase-change memory cell of FIG. 7A.

FIG. 7C is a side view of the phase-change memory cell 700 of FIG. 7A. As compared in the side view of FIG. 6C, the gates G11 and G21 of the first and second FinFETs control transistors N31 and N32 are formed to enclose active areas ACTIVE, thereby elongating channels CH of the gates.

Figure 7D:
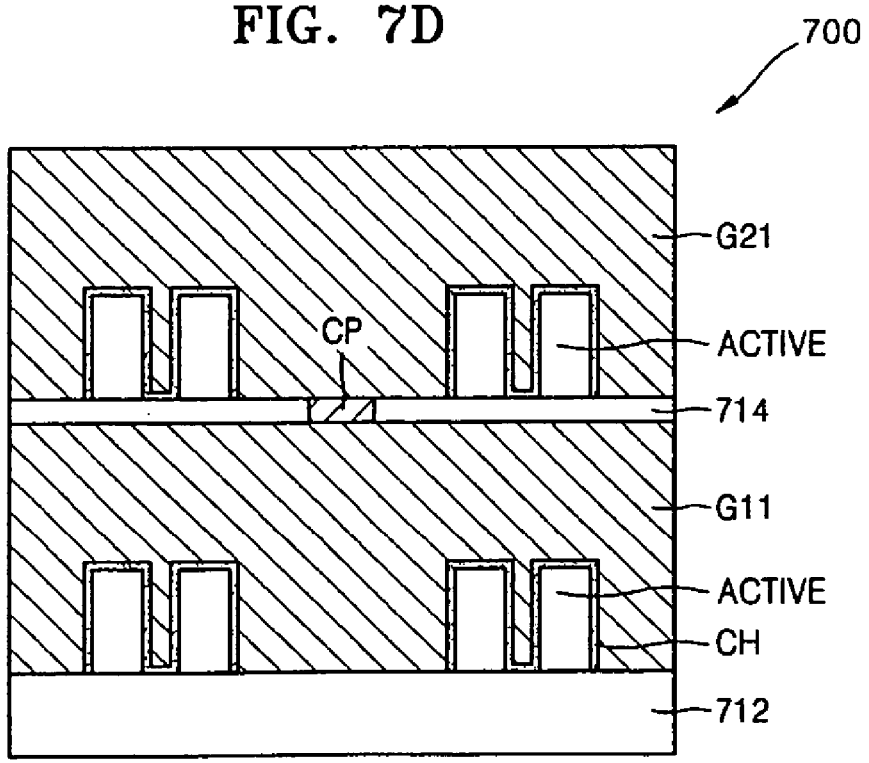
FIG. 7D is a side view of a phase-change memory cell according to another embodiment of the present invention.

Alternatively, the first and second control transistors N31 and N32 may have a Multi-Channel Field Effect Transistor (McFET) structure. FIG. 7D is a side view of a phase-change memory cell according to another embodiment of the present invention. The McFET is illustrated in FIG. 7D.

The structure of the McFET is similar to that of the FinFET but is different from the FinFET in terms of the active areas ACTIVE as illustrated in FIG. 7D. That is, the active areas ACTIVE of FIG. 7D are formed in different manner from those of FIG. 7C so as to make the channels CH longer.

As described above, first and second control transistors of a phase-change memory cell according to the present invention may have a planar transistor structure, a FinFET structure, or a McFET structure.

Figure 8A:
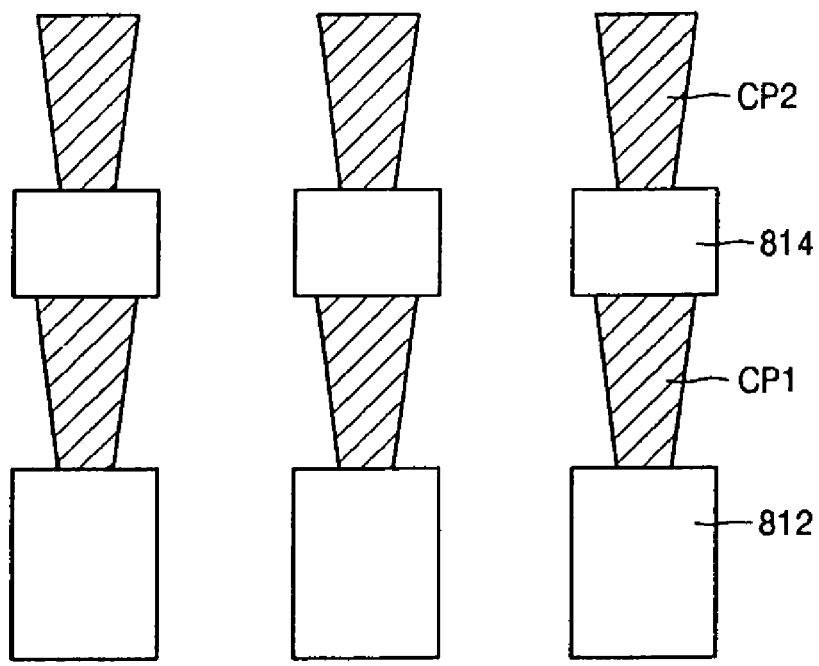
FIG. 8A is a diagram illustrating connection of contact plugs to substrates such as those illustrated in FIG. 6A or 7A, according to an embodiment of the present invention.

FIG. 8A is a diagram illustrating connection of contact plugs to first and second substrates 812 and 814, respectively, such as those shown in FIGS. 6A and 7A, according to an embodiment of the present invention. Referring to FIG. 8A, a contact plug CP1 is connected to the top of the first substrate 812 and the bottom of the second substrate 814. A contact plug CP2 is connected to the top of the second substrate 814. Also, the contact plug CP2 may be connected to an external power source, e.g., a ground voltage source.

However, electrical connection of the first substrate 812 to an external power source causes contact resistance on the contact surfaces of the contact plugs CP1 and CP2 and the first and second substrates 812 and 814. Accordingly, it is desired that the contact resistance be mitigated.

Figure 8B:
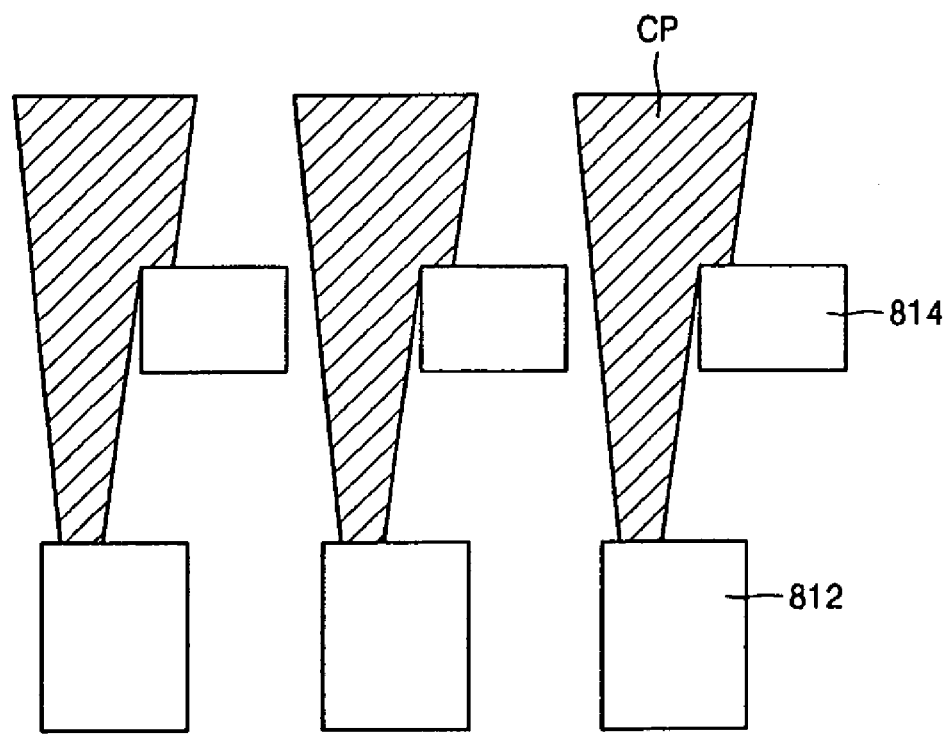
FIG. 8B is a diagram illustrating connection of contact plugs to substrates, which reduces contact resistance, according to another embodiment of the present invention.

FIG. 8B is a diagram illustrating connection of contact plugs to substrates, which reduces contact resistance, according to another embodiment of the present invention.

The second substrate 614 of the phase-change memory cell 600 illustrated in FIG. 6A and the second substrate 714 of the phase-change memory cell 700 illustrated in FIG. 7A are arranged to be in parallel with, and partially overlap, the first substrate 612 and the first substrate 712, respectively.

Specifically, referring to FIG. 8B, the second substrate 814 is slightly diagonally moved to the left or right side of the first substrate 812, perpendicular to the first substrate 812. The contact plug CP is formed of a conductive layer connected to but not separated by the second substrate 814, and extends from an external power source (not shown) to the first substrate 812. Accordingly, it is possible to significantly reduce the contact resistance.

Referring back to FIGS. 6A and 7A, the contact plugs CP12 and CP22 that connect the variable resistance devices 616 and 716 to the drain D1 of the first control transistor N31, and the contact plugs CP11 and CP12 that connect the external power source to the source S1 and the drain D1 of the first control transistor N31 are formed of a conductive layer connected to but not separated by the second substrates 614 and 714.

FIGS. 9A through 9D are cross-sectional views illustrating a method of fabricating a phase-change memory cell according to an embodiment of the present invention. First, referring to FIG. 9A, a first control transistor N31 having a source, gate, and drain is formed on a first substrate 912, a gate G11 is enclosed by an insulting material I1 and a bottom of the gate G11 is coated with a dielectric layer I2.

Figure 9A:
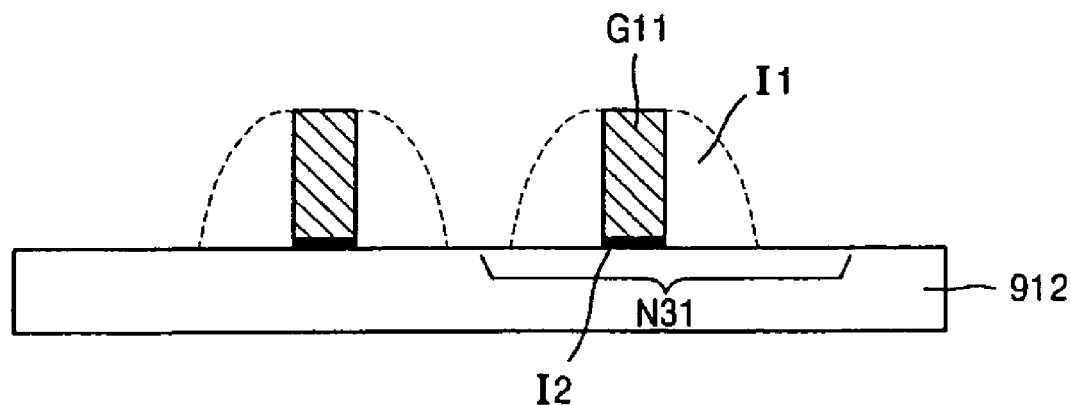
FIGS. 9A through 9D are cross-sectional views illustrating a method of fabricating a phase-change memory cell according to an embodiment of the present invention.
Figure 9B:
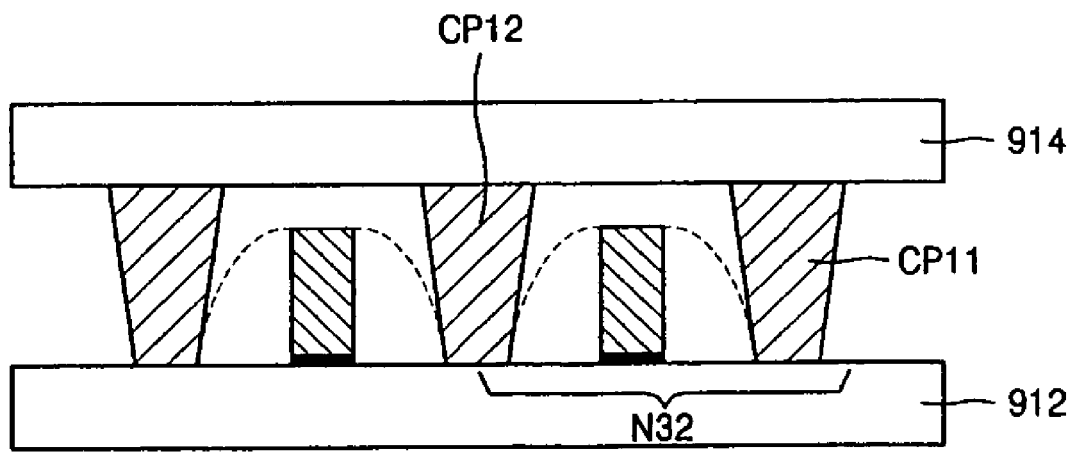

Next, referring to FIG. 9b, a second substrate 914 is formed on the first control transistor N31, and contact plugs CP11 and CP12 are formed on the first substrate 912, and contact the second substrate 914.

Figure 9C:
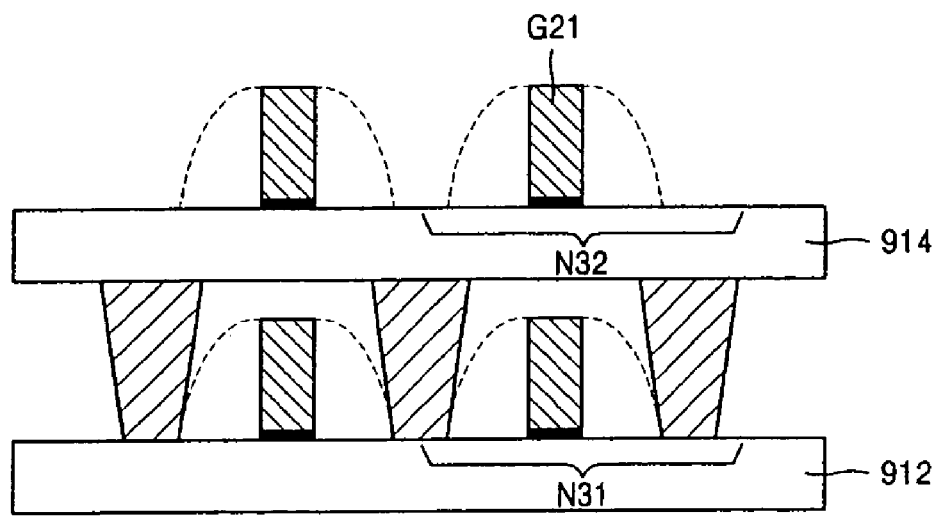
Figure 9D:
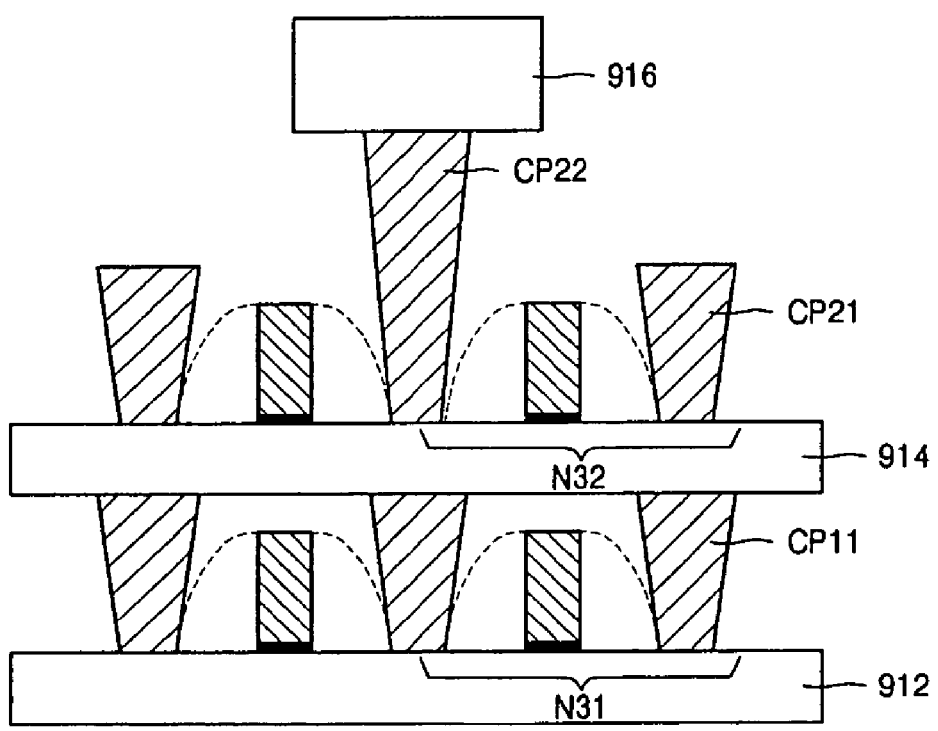

Next, referring to FIG. 9C, a second control transistor N32 having a source, gate, and drain is formed on the second substrate 914. Lastly, referring to FIG. 9D, contact plugs CP21 and CP22 are formed on the second substrate 914, and a variable resistance device 916 formed of a phase-change material is connected to one of the source and drain of the second control transistor N32 via the contact plug CP22.

The method illustrated in FIGS. 9A through 9D may further include forming a contact plug that connects the variable resistance device 916 to the source or the drain of the first control transistor N31, and a contact plug that connects an external power source to the source or the drain of the first control transistor N31, as illustrated in FIG. 8B.

The construction of the phase-change memory cell obtained according to the method of FIGS. 9A through 9D have been described above.

As described above, a semiconductor memory device according to the present invention includes a plurality of phase-change memory cells, each having a plurality of control transistors formed on different layers and variable resistance devices formed of a phase-change material. In addition, the semiconductor memory device has a hierarchical bit line structure that uses a global bit line and local bit lines, thereby increasing the integration density of the semiconductor memory device and the amount of current flowing through each of the phase-change memory cells.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A phase-change memory cell comprising:
    a plurality of control transistors formed on different layers; and
    a variable resistance device formed of a phase-change material, the variable resistance device coupled to each of the control transistors, wherein the plurality of control transistors are connected to each other in parallel.

2. The phase-change memory cell of claim 1, wherein the number of the control transistors is two.

3. The phase-change memory cell of claim 1, wherein the control transistors comprise:
    a first control transistor which is a bulk transistor; and
    a second control transistor formed on the first control transistor and being a thin layer transistor.

4. The phase-change memory cell of claim 3, wherein the control transistors further comprise a third control transistor formed on the second control transistor.

5. The phase-change memory cell of claim 4, wherein each of the control transistors is one of a MOS transistor and a bipolar transistor.

6. The phase-change memory cell of claim 4, wherein the plurality of the control transistors form a diode.

7. The phase-change memory cell of claim 1, wherein the variable resistance device comprises germanium (Ge), antimony (Sb), and tellurium (Te).

8. A semiconductor memory device comprising:
    a global bit line;
    a plurality of local bit lines connected to or disconnected from the global bit line via local bit line selection circuits which correspond to the local bit lines, respectively; and
    a plurality of phase-change memory cell groups storing data when connected to the local bit lines, respectively, wherein each of the phase-change memory cells of each of the phase-change memory cell groups comprises:
        a plurality of control transistors formed on different layers; and
        a variable resistance device formed of a phase-change material, the variable resistance device coupled to each of the control transistors, wherein the plurality of control transistors are connected to each other in parallel.

9. The semiconductor memory device of claim 8, wherein the local bit line selection circuits are transistors which connect the local bit lines to the global bit line or disconnect the local bit lines from the global bit line in response to a local bit line selection signal.

10. The semiconductor memory device of claim 8, wherein gates of the control transistors are connected to a corresponding word line.

11. The semiconductor memory device of claim 8, wherein the number of the plurality of control transistors is two.

12. The semiconductor memory device of claim 8, wherein each of the plurality of control transistors comprises:
    a first control transistor which is a bulk transistor; and
    a second control transistor formed on the first control transistor and being a thin layer transistor.

13. The semiconductor memory device of claim 12, wherein each of the plurality of control transistors further comprises a third control transistor formed on the second control transistor.

14. The semiconductor memory device of claim 13, wherein each of the control transistors is one of a MOS transistor and a bipolar transistor.

15. The semiconductor memory device of claim 13, wherein the plurality of the control transistors form a diode.

16. The semiconductor memory device of claim 8, wherein the variable resistance device comprises germanium (Ge), antimony (Sb), and tellurium (Te).

17. The semiconductor memory device of claim 8, further comprising a peripheral circuit, wherein the peripheral circuit is an inverter circuit which includes a bulk transistor and a thin layer transistor formed on the bulk transistor.

18. The semiconductor memory device of claim 17, wherein the bulk transistor is an NMOS transistor and the thin layer transistor is a PMOS transistor.

19. The semiconductor memory device of claim 18, further comprising a sense amplifier connected to the global bit line.

20. A phase-change memory cell comprising:
    a plurality of control transistors, gate of each of which are connected to a same word line, and the control transistors formed at different layers; and
    a variable resistance device formed of a phase-change material, wherein one of a first terminal and a second terminal of each of the control transistors is connected to the variable resistance device and the other is connected to a ground voltage, wherein the plurality of control transistors are connected to each other in parallel.

21. The phase-change memory cell of claim 20, wherein the control transistors comprise:
   a first control transistor which is a bulk transistor; and
   a second control transistor formed on the first control transistor and being a thin layer transistor.

22. The phase-change memory cell of claim 21, wherein the control transistors further comprise a third control transistor formed on the second control transistor.

23. The phase-change memory cell of claim 20, wherein each of the control transistors is one of a MOS transistor and a bipolar transistor.

24. The phase-change memory cell of claim 20, wherein the control transistors form a diode.

25. A phase-change memory cell comprising:
   a first control transistor formed on a first substrate and having a source, gate, and drain;
   a second substrate formed on the first control transistor;
   a second control transistor formed on the second substrate and having a source, gate, and drain; and
   a variable resistance device connected to one of the source and the drain of the second control transistor and formed of a phase-change material, wherein:
      the source of the first control transistor is electrically connected to the source of the second control transistor,
      the drain of the first control transistor is electrically connected to the drain of the second control transistor, and
      the gate of the first control transistor is electrically connected to the gate of the second control transistor.

26. The phase-change memory cell of claim 25, wherein the first and second control transistors have a planar transistor structure.

27. The phase-change memory cell of claim 25, wherein the first and second control transistors have a fin field effect transistor structure.

28. The phase-change memory cell of claim 25, wherein the first and second control transistors have a multi-channel field effect transistor structure.

29. The phase-change memory cell of claim 25, wherein the first control transistor is a bulk transistor and the second control transistor is a thin layer transistor.

30. The phase-change memory cell of claim 25, wherein the second substrate is formed to be parallel with the first substrate and partially overlap the first substrate, and a first contact plug which connects the variable resistance device to one of the source and the drain of the first control transistor, and a second contact plug which connects an external power source to one of the source and the drain of the first control transistor are formed of a conductive layer.

31. The phase-change memory cell of claim 30, wherein the contact plugs are connected to the source and drain of the second control transistor.

32. The phase-change memory cell of claim 25, wherein the first and second control transistors have different structures which are selected from the structures of a planar transistor, a fin field effect transistor, and a multi-channel field effect transistor.

33. A method of fabricating a phase-change memory cell comprising:
   forming a first control transistor having a source, gate, and drain on a first substrate;
   forming a second substrate on the first control transistor;
   forming a second control transistor having a source, gate, and drain on the second substrate; and
   connecting a variable resistance device to one of the source and the drain of the second control transistor, the variable resistance device formed of a phase-change material, wherein:
      the source of the first control transistor is electrically connected to the source of the second control transistor,
      the drain of the first control transistor is electrically connected to the drain of the second control transistor, and
      the gate of the first control transistor is electrically connected to the gate of the second control transistor.

34. The method of claim 33, wherein the first and second control transistors have a planar transistor structure.

35. The method of claim 33, wherein the first and second control transistors have a fin field effect transistor structure.

36. The method of claim 33, wherein the first and second control transistors have a multi-channel field effect transistor structure.

37. The method of claim 33, wherein the first control transistor is a bulk transistor, and the second control transistor is a thin layer transistor.

38. The method of claim 33, wherein the second substrate is formed to be parallel with the first substrate and partially overlap with the first substrate.

39. The method of claim 38, further comprising forming a first contact plug which connects the variable resistance device to one of the source and the drain of the first control transistor, and a second contact plug which connects an external power source to one of the source and the drain of the first control transistor, wherein the contact plugs are formed of a conductive layer.

40. The method of claim 39, wherein the contact plugs are connected to the source and drain of the second control transistor.

41. The method of claim 33, wherein the first and second control transistors have different structures which are selected from the structures of a planar transistor, a fin field effect transistor, and a multi-channel field effect transistor.

* * * * *